United States Patent
Yang

(10) Patent No.: US 11,275,125 B2
(45) Date of Patent: Mar. 15, 2022

(54) INSPECTION DEVICE, INSPECTION METHOD, INSPECTION PROGRAM, MANAGEMENT DEVICE, AND POWER STORAGE SYSTEM

(71) Applicant: Panasonic Intellectual Property Management Co., Ltd., Osaka (JP)

(72) Inventor: Changhui Yang, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 213 days.

(21) Appl. No.: 16/476,101

(22) PCT Filed: Dec. 22, 2017

(86) PCT No.: PCT/JP2017/046077
§ 371 (c)(1),
(2) Date: Jul. 4, 2019

(87) PCT Pub. No.: WO2018/131427
PCT Pub. Date: Jul. 19, 2018

(65) Prior Publication Data
US 2019/0353693 A1 Nov. 21, 2019

(30) Foreign Application Priority Data

Jan. 16, 2017 (JP) .............................. JP2017-005443

(51) Int. Cl.
*G01R 31/3842* (2019.01)
*G01R 31/52* (2020.01)
*H02J 7/00* (2006.01)

(52) U.S. Cl.
CPC ......... *G01R 31/52* (2020.01); *G01R 31/3842* (2019.01); *H02J 7/0021* (2013.01)

(58) Field of Classification Search
CPC ... G01R 31/52; G01R 31/3842; H02J 7/0021; Y02E 60/10; H01M 10/44; H01M 10/48
See application file for complete search history.

(56) References Cited

U.S. PATENT DOCUMENTS

2002/0109506 A1\* 8/2002 Kawakami ........... G01R 31/392
324/522
2003/0006735 A1\* 1/2003 Kawakami ......... G01R 31/3828
320/133
(Continued)

FOREIGN PATENT DOCUMENTS

| JP | 2003-059544 | 2/2003 |
| JP | 2010-218976 | 9/2010 |
| JP | 2013-254586 | 12/2013 |

OTHER PUBLICATIONS

International Search Report of PCT application No. PCT/JP2017/046077 dated Apr. 3, 2018.

*Primary Examiner* — Nghia M Doan
(74) *Attorney, Agent, or Firm* — McDermott Will and Emery LLP

(57) ABSTRACT

An input and output device of an inspection device is configured to instruct charging devices capable of charging respective cells to perform constant current charging or constant voltage charging, and acquire a voltage value and a current value of each of the cells from corresponding one of the charging devices. A controller of the inspection device is configured to instruct the charging devices to perform constant current charging of the respective cells, and perform constant voltage charging of the respective cells when a voltage value of each of the cells acquired from corresponding one of the charging devices reaches a preset value. The controller of the inspection device is configured to determine presence or absence of a micro-short circuit in each of the cells with reference to a peak current value of (Continued)

corresponding one of the cells generated in switching from the constant current charging to the constant voltage charging.

5 Claims, 9 Drawing Sheets

(56) References Cited

U.S. PATENT DOCUMENTS

2015/0061573 A1\* 3/2015 Masato ................. H02J 7/0047
320/107
2016/0336767 A1\* 11/2016 Zane ..................... H02J 7/0068

\* cited by examiner

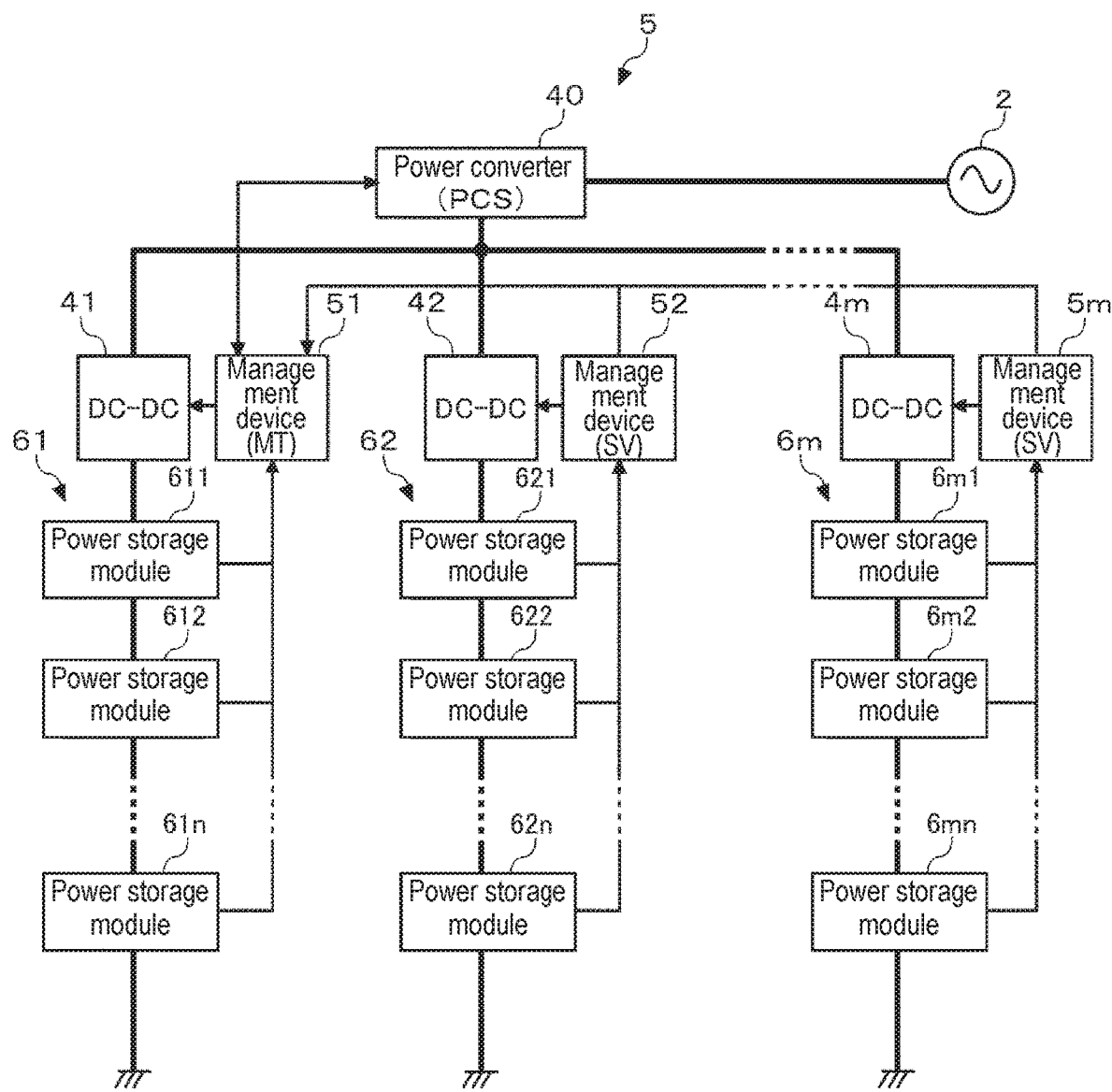

INSPECTION DEVICE, INSPECTION METHOD, INSPECTION PROGRAM, MANAGEMENT DEVICE, AND POWER STORAGE SYSTEM

TECHNICAL FIELD

The present invention relates to an inspection device, an inspection method, an inspection program, a management device, and a power storage system that are configured to inspect presence or absence of a micro-short circuit.

BACKGROUND ART

In recent years, secondary batteries, such as lithium ion batteries and nickel hydride batteries, have been used for various purposes. In such a battery, a micro-short circuit may occur between its electrodes due to foreign matter, such as dust or dirt, which may be mixed in the battery during a process of manufacturing a secondary battery cell. A micro-short circuit may cause overheating, and thus should be removed by inspection before shipment.

One way for detecting a micro-short circuit in a cell is to determine that a cell showing a large reduction in voltage as compared to a normal cell during a suspension period of charging and discharging is a micro-short-circuited cell. Another way for the detection is to determine that a cell showing a small increase in voltage as compared to a normal cell during constant current charging is a micro-short-circuited cell. Another way for the detection is to determine that a cell showing a large reduction in voltage as compared to a normal cell during constant current discharging is a micro-short-circuited cell. A yet another way for the detection is to determine that a cell showing a small reduction in charging current as compared to a normal cell during constant current charging is a micro-short-circuited cell (See PTL 1, for example).

CITATION LIST

Patent Literature

PTL 1: Unexamined Japanese Patent Publication No. 2003-59544

SUMMARY OF THE INVENTION

One of the above described ways in which a micro-short circuit is detected based on the voltage after a suspension period, which is provided after charging, has a problem that a reduction in voltage during the suspension period is minute if the short circuit occurs with high resistance. In this case, a cell may be determined as non-defective even if foreign matter is mixed in, since the minute reduction in voltage may not reach a reference voltage for quality determination. This may lead to shipment of the cell with foreign matter mixed in. In addition, the suspension period needs to be relatively long so as to detect a micro-short circuit. With the above-described other methods, a defective cell can hardly be detected with high accuracy unless a value of micro-short circuit resistance is low, such as several tens of ohms. In the case where the micro-short circuit resistance is several hundred ohms, the voltage or the charging current varies only slightly, which makes it difficult to determine presence or absence of a micro-short circuit with high accuracy.

The present invention has been made in view of the above circumstances, and an object thereof is to provide a technique that enables determination of presence or absence of a micro-short circuit with high accuracy in a short period of time.

An inspection device according to an aspect of the present invention includes: an input and output device configured to instruct a charging device capable of charging a cell to perform constant current charging or constant voltage charging, and acquire a voltage value and a current value of the cell from the charging device; and a controller configured to instruct the charging device to perform constant current charging of the cell, and perform constant voltage charging of the cell when a voltage value of the cell acquired from the charging device reaches a preset value. The controller is configured to determine presence or absence of a micro-short circuit in the cell with reference to a peak current value of the cell generated in switching from the constant current charging to the constant voltage charging.

Any desired combinations of the above-described configuration elements and converted expressions of the present invention in methods, devices, systems, computer programs, and other similar entities are still effective as aspects of the present invention.

The present invention enables determination of presence or absence of a micro-short circuit with high accuracy in a short period of time.

BRIEF DESCRIPTION OF DRAWINGS

FIG. 9 is a view illustrating a configuration of a power storage system according to a second exemplary embodiment of the present invention.

DESCRIPTION OF EMBODIMENTS

First Exemplary Embodiment

Figure 1:
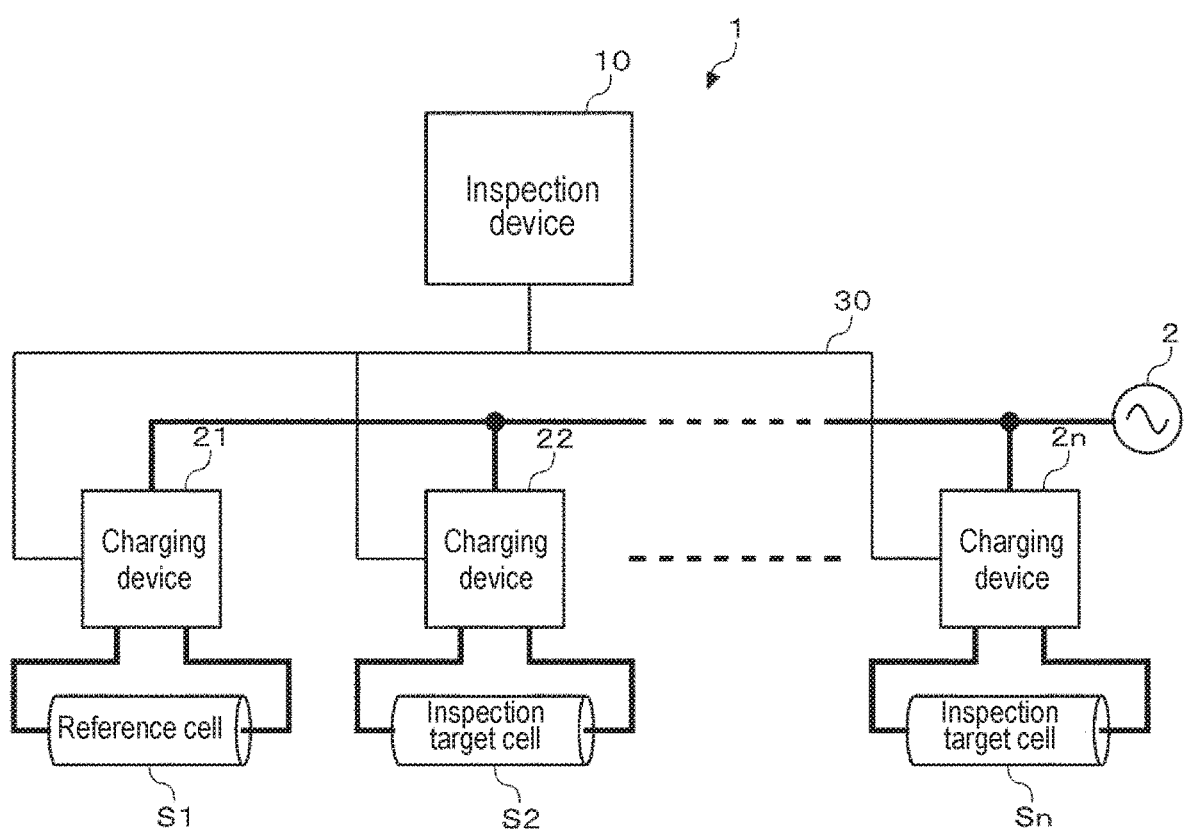
FIG. 1 is a view showing a configuration of an inspection system according to a first exemplary embodiment of the present invention.

FIG. 1 is a view showing a configuration of inspection system 1 according to a first exemplary embodiment of the present invention. Inspection system 1 is a system configured to inspect cells for a micro-short circuit. Inspection system 1 is configured to inspect lithium ion battery cells, nickel hydride battery cells, lead-acid battery cells, electric double layer capacitor cells, lithium ion capacitor cells, and the like. Hereinafter, the present exemplary embodiment gives an example in which a cylindrical lithium ion battery (nominal voltage: 3.6 V to 3.7 V) is subjected to inspection.

Inspection system 1 includes inspection device 10 and charging devices 21-2n, and inspection device 10 is connected with each of charging devices 21-2n through communication line 30. Inspection device 10 may be a general-purpose information processing device (a personal computer (PC), a tablet, a smartphone, etc.), or may be a dedicated device for inspection.

Among charging devices 21-2n, one charging device 21 is connected with reference cell S1, and the other charging devices 22-2n are respectively connected with inspection target cells S2-Sn. Reference cell S1 is a cell to be compared with inspection target cells S2-Sn, and is a normal cell in which no micro-short circuit occurs.

Charging device 21 is configured to charge reference cell S1. Charging device 21 includes an AC/DC converter, a current sensor, a voltage sensor, and a controller. The AC/DC converter is configured to output DC power by converting AC power supplied from commercial power supply system 2 (hereinafter simply referred to as system 2) to DC power. The current sensor is configured to detect an output current from charging device 21 (an electric current flowing in reference cell S1). The voltage sensor is configured to detect an output voltage from charging device 21 (a voltage applied to reference cell S1).

The controller is configured to notify inspection device 10 of the output current detected by the current sensor and the output voltage detected by the voltage sensor through communication line 30. The controller is configured to control the AC/DC converter based on a control instruction notified by inspection device 10, the output current detected by the current sensor, and the output voltage detected by voltage sensor.

In the case where inspection device 10 issues an instruction of constant current charging (hereinafter referred to as CC charging), for example, the controller controls a duty cycle of a switching element in the AC/DC converter so that the detected output current maintains a target current value. For example, the controller decreases the duty cycle when the detected output current is greater than the target current value, and increases the duty cycle when the detected output current is less than the target current value. In the case where inspection device 10 issues an instruction of constant voltage charging (hereinafter referred to as CV charging), for example, the controller controls the duty cycle of the switching element in the AC/DC converter so that the detected output voltage maintains a target voltage value.

Charging devices 22-2n are configured to charge inspection target cells S2-Sn respectively, and have a configuration identical to that of charging device 21. A common AC/DC converter may be provided between system 2 and charging devices 21-2n. In such a case, each of charging devices 21-2n includes a DC/DC converter, instead of an AC/DC converter.

When electric power charged in reference cell S1 and inspection target cells S2-Sn is discharged, electric current is fed through a load resistor (not shown) or fed back to system 2 for regeneration. In the case where electric current is fed back to system 2 for regeneration, each of charging devices 21-2n requires a bidirectional AC/DC converter or a bidirectional DC/DC converter.

Figure 2:
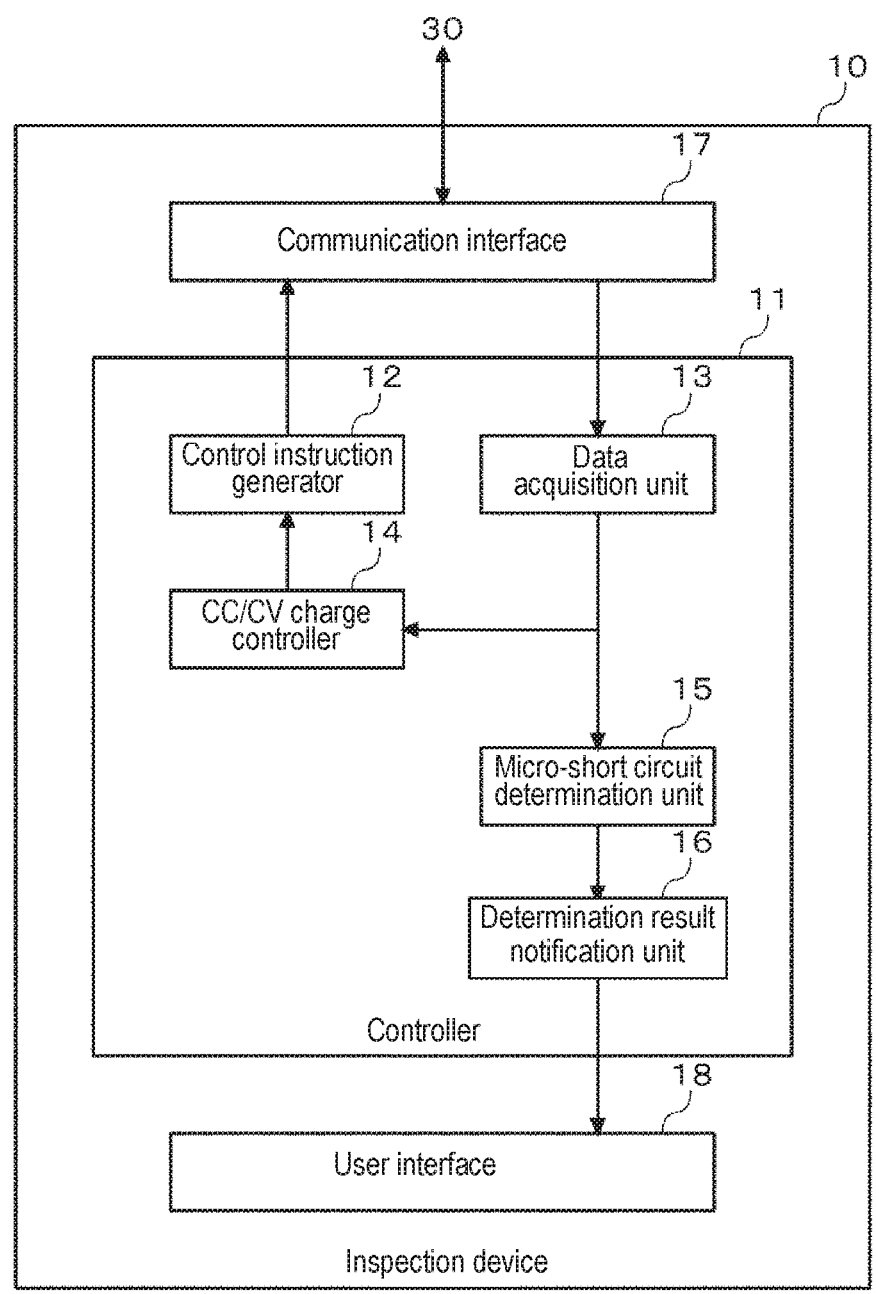
FIG. 2 is a block diagram illustrating a configuration example of an inspection device in FIG. 1.

FIG. 2 is a block diagram illustrating a configuration example of inspection device 10 in FIG. 1. Inspection device 10 includes controller 11, communication interface 17, and user interface 18. Controller 11 includes control instruction generator 12, data acquisition unit 13, CC/CV charge controller 14, micro-short circuit determination unit 15, and determination result notification unit 16. The configuration of controller 11 may be provided by hardware and software resources working together or hardware resources alone. Available hardware resources include microcomputers, digital signal processors (DSPs), field-programmable gate arrays (FPGAs), read-only memories (ROMs), random-access memories (RAMS), and other large-scale integrated circuits (LSIs). The software resource may be a program such as firmware.

Control instruction generator 12 is configured to generate a CC charge instruction including a target current value, or a CV charge instruction including a target voltage value, and notify charging devices 21-2n of the instruction through communication interface 17. Data acquisition unit 13 is configured to acquire a current value and a voltage value of each of reference cell S1 and inspection target cells S2-Sn from charging devices 21-2n through communication interface 17. Data acquisition unit 13 is configured to transmit the acquired current value and voltage value to CC/CV charge controller 14 and micro-short circuit determination unit 15.

Communication interface 17 is configured to execute a predetermined communication control processing (such as communication control processing conformance to a standard of TCP/IP, RS-485, or the like), and communicate with charging devices 21-2n through communication line 30. Communication line 30 may be a metal cable or an optical fiber cable.

During inspection, CC/CV charge controller 14 instructs control instruction generator 12 to perform CC charging in a state where a voltage value of reference cell S1 is less than a preset value, and instructs control instruction generator 12 to perform CV charging in a state where the voltage value of reference cell S1 is equal to or greater than the preset value. Micro-short circuit determination unit 15 is configured to determine presence or absence of a micro-short circuit in each of inspection target cells S2-Sn based on a current value at the time of switching charging of inspection target cells S2-Sn from CC charging to CV charging. Determination result notification unit 16 is configured to output a determination result of presence or absence of a micro-short circuit in each of inspection target cells S2-Sn to user interface 18. User interface 18 includes at least one of a display, a speaker, and a printer, and is configured to output the determination result by performing at least one of displaying, sound output, and printing.

Figure 3:
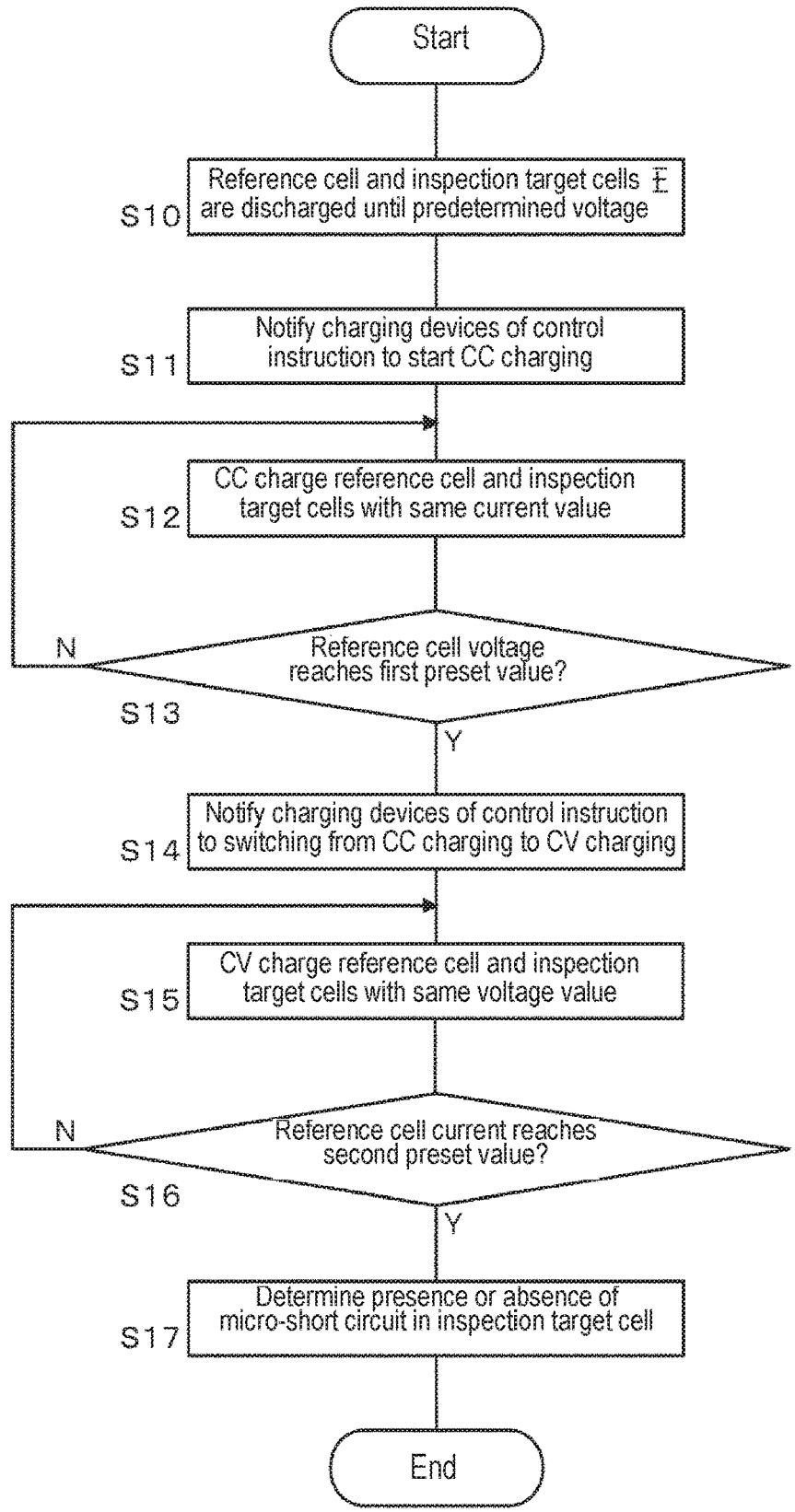
FIG. 3 is a flowchart illustrating an operation of the inspection system according to the first exemplary embodiment of the present invention.

FIG. 3 is a flowchart illustrating an operation of inspection system 1 according to the first exemplary embodiment of the present invention. Control instruction generator 12 is configured to generate a control instruction for causing reference cell S1 and inspection target cells S2-Sn to be discharged until a predetermined voltage (a discharge termination voltage, for example) is reached, and notify charging devices 21-2n of the control instruction of the control instruction (S10). In the case of lithium ion battery cells, a discharge termination voltage is normally set at about 3.0 V (state of charge (SOC)=0%).

In a state where voltages of reference cell S1 and inspection target cells S2-Sn are all at the predetermined voltage, control instruction generator 12 generates a control instruction to start CC charging, and notify charging devices 21-2n of the control instruction (S11). This control instruction includes a target current value (0.58 A=0.2 C, for example). When receiving this control instruction, charging devices 21-2n starts CC charging of reference cell S1 and inspection target cells S2-Sn (S12).

When a voltage value of reference cell S1 acquired by data acquisition unit 13 reaches a first preset value (4.2 V, for example) (Y in S13), control instruction generator 12 generates a control instruction for switching from CC charging to CV charging, and notifies charging devices 21-2n of the control instruction (S14). This control instruction includes a target voltage value (4.2 V for example). When receiving this control instruction, charging devices 21-2n start CV charging of reference cell S1 and inspection target cells S2-Sn (S15).

When a current value of reference cell S1 acquired by data acquisition unit 13 reaches a second preset value (20 mA, for example) (Y in S16), micro-short circuit determination unit 15 determines presence or absence of a micro-short circuit in each of inspection target cells S2-Sn based on a peak current value generated at the time of switching charging of inspection target cells S2-Sn from CC charging to CV charging (S17). For example, micro-short circuit determination unit 15 calculates a difference between a peak current value of inspection target cells S2-Sn at the time of switching from CC charging to CV charging and a current value of reference cell S1, and determines that an inspection target cell having the difference equal to or greater than a threshold value is a cell with a micro-short circuit. Micro-short circuit determination unit 15 determines that an inspection target cell having the difference less than the threshold value is a cell without a micro-short circuit.

Figure 4A:
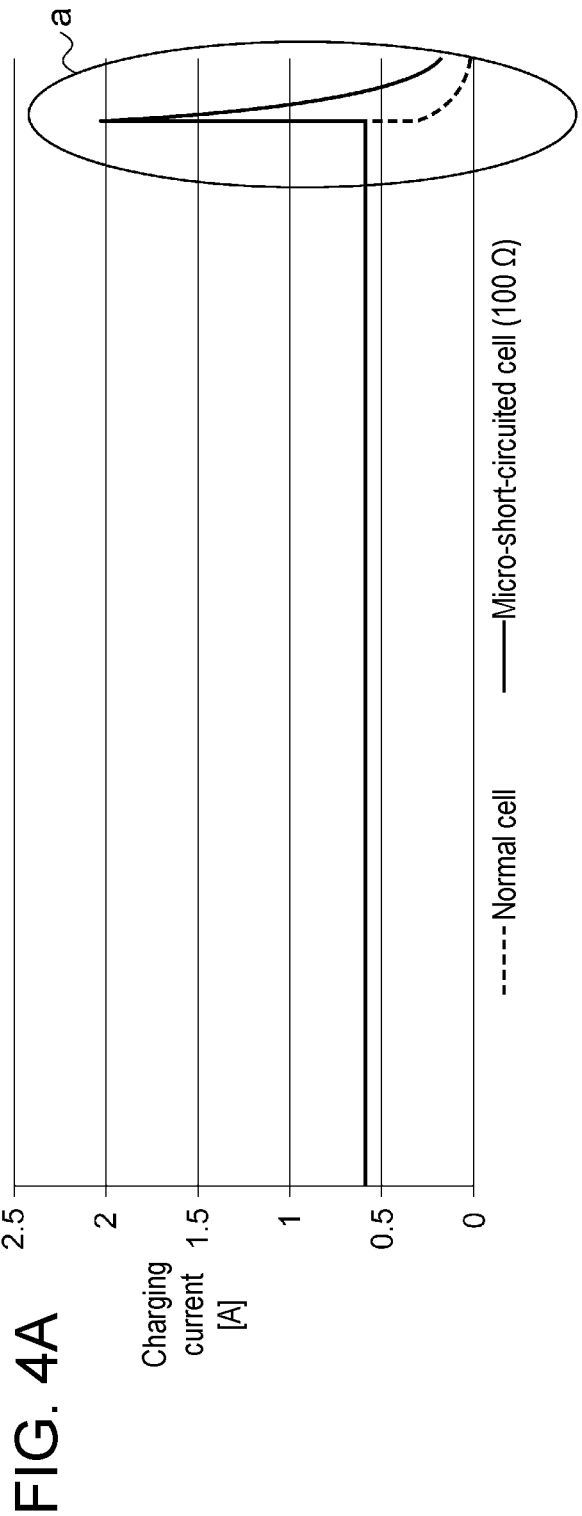
FIGS. 4A and 4B are views each illustrating a simulation result (where micro-short circuit resistance=100Ω) of an inspection method according to the first exemplary embodiment of the present invention.
Figure 4B:
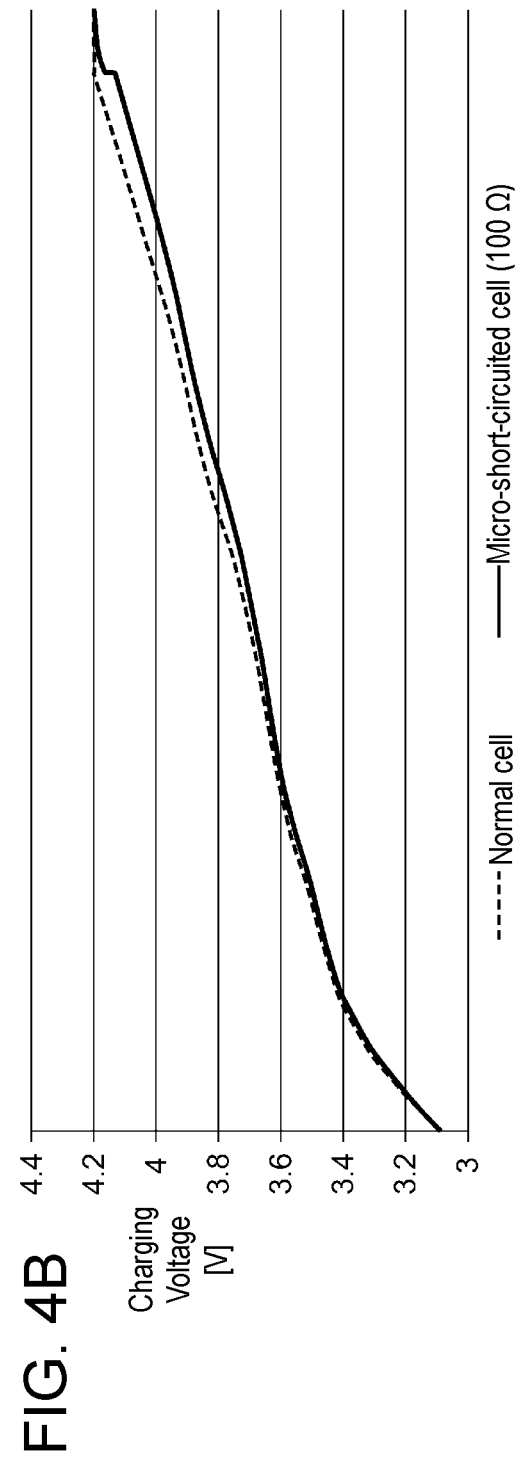

FIGS. 4A and 4B are views each illustrating a simulation result (where micro-short circuit resistance=100Ω) of an inspection method according to the first exemplary embodiment of the present invention. In this example, an inspection target cell is a cell having micro-short circuit resistance of 100Ω (hereinafter, referred to as a micro-short-circuited cell). FIG. 4A shows transitions of charging currents of a normal cell and a micro-short-circuited cell during inspection, and FIG. 4B shows transitions of charging voltages of a normal cell and a micro-short-circuited cell. A target current value at the time of CC charging is 0.58 A, and a target voltage value at the time of CV charging is 4.2 V. In the micro-short-circuited cell, a peak current of about 2.0 A is instantaneously generated at the time of switching from CC charging to CV charging (see region a). In the normal cell (micro-short circuit resistance=∞), almost no peak current is generated.

Figure 5A:
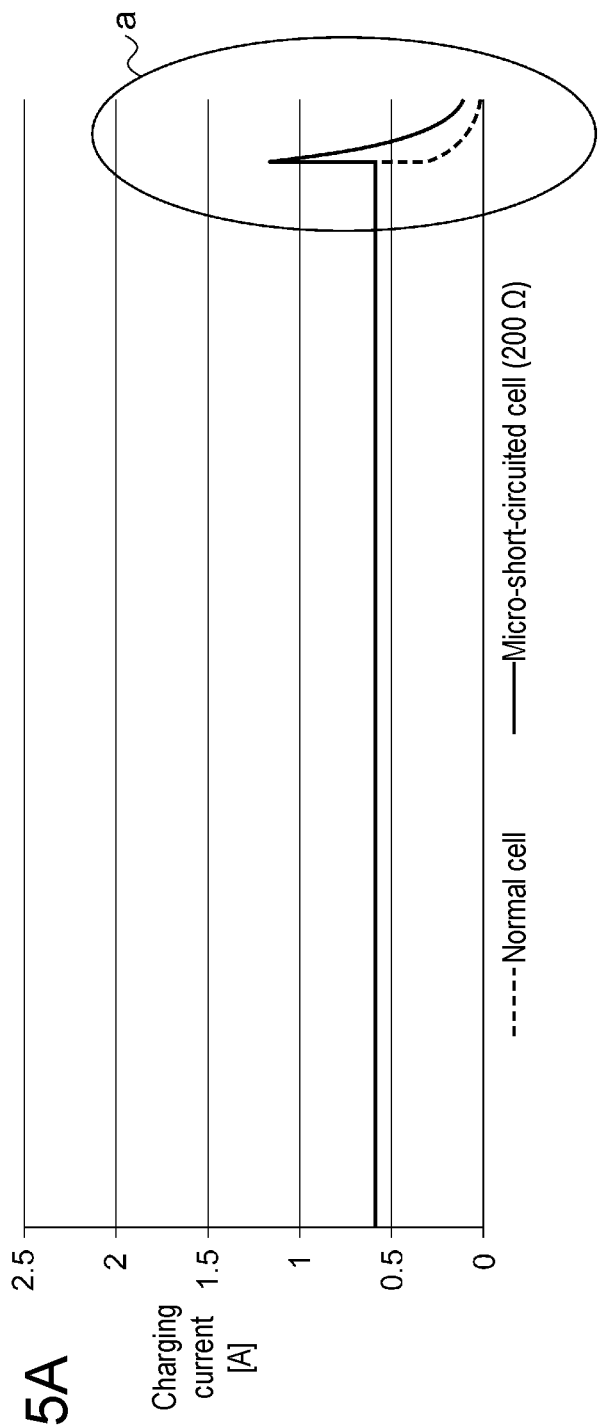
FIGS. 5A and 5B are views each illustrating a simulation result (where micro-short circuit resistance=200Ω) of the inspection method according to the first exemplary embodiment of the present invention.
Figure 5B:
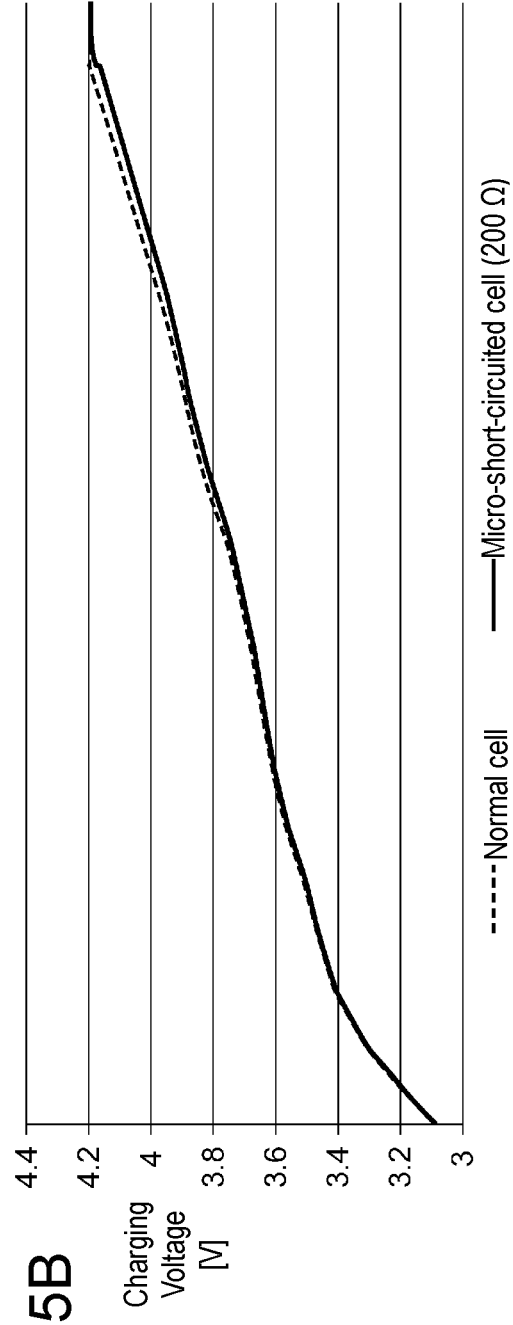

FIGS. 5A and 5B are views each illustrating a simulation result (where micro-short circuit resistance=200Ω) of the inspection method according to the first exemplary embodiment of the present invention. In this example, a peak current of about 1.2 A is generated in a micro-short-circuited cell at the time of switching from CC charging to CV charging (see region a). The peak current value is less than that of the simulation result shown in FIG. 4A.

Figure 6A:
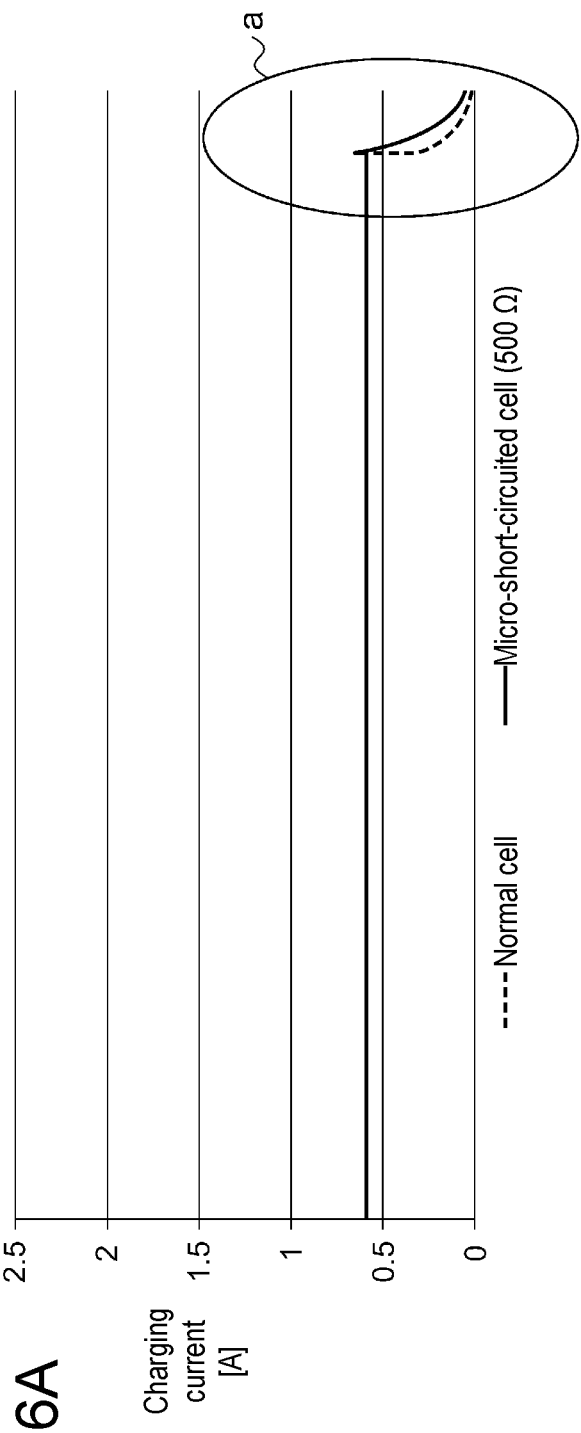
FIGS. 6A and 6B are views each illustrating a simulation result (where micro-short circuit resistance=500Ω) of the inspection method according to the first exemplary embodiment of the present invention.
Figure 6B:
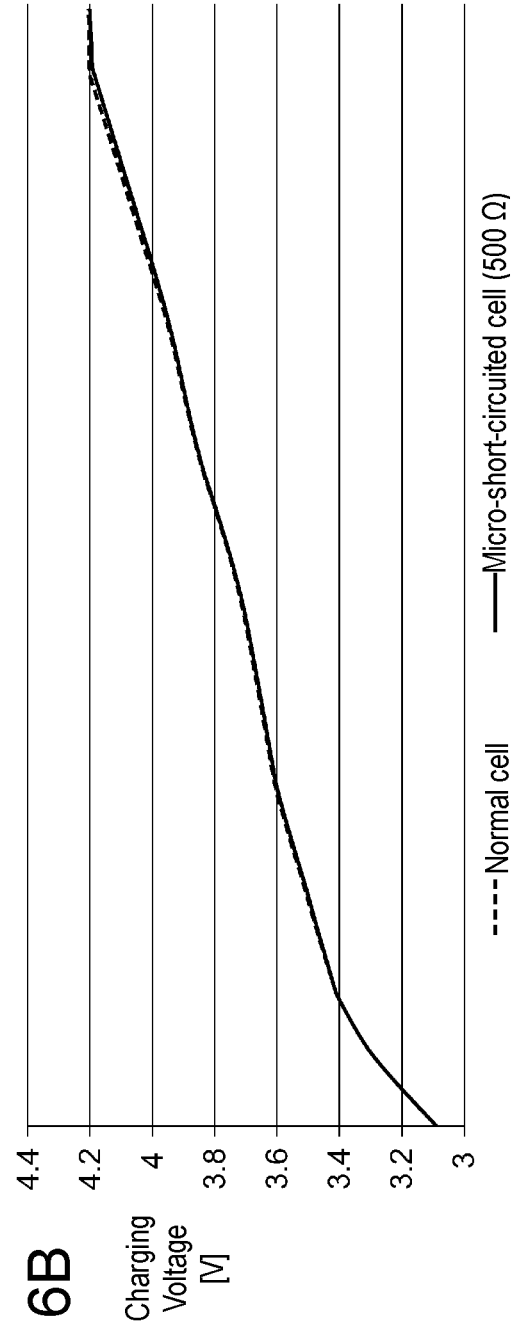

FIGS. 6A and 6B are views each illustrating a simulation result (where micro-short circuit resistance=500Ω) of the inspection method according to the first exemplary embodiment of the present invention. In this example, almost no peak current is generated in a micro-short-circuited cell at the time of switching from CC charging to CV charging (see region a) like in a normal cell.

Figure 7:
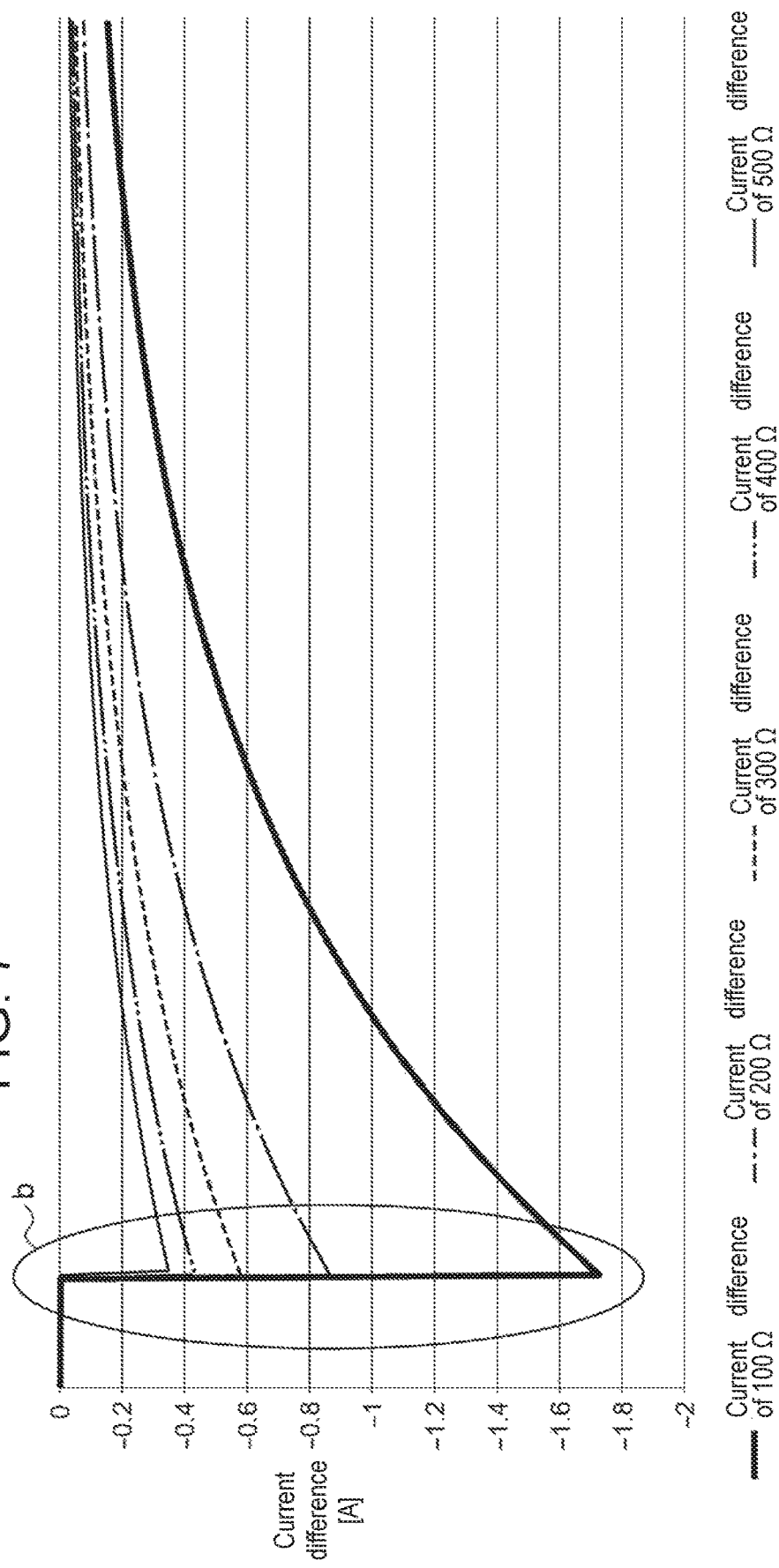
FIG. 7 is a view summarizing current differences between a normal cell and a micro-short-circuited cell in the simulation results of the inspection method according to the first exemplary embodiment of the present invention.

FIG. 7 is a view summarizing current differences between a normal cell and a micro-short-circuited cell in the simulation results of the inspection method according to the first exemplary embodiment of the present invention. The prem-ise is that a target current value at the time of CC charging is 0.58 A, and a target voltage value at the time of CV charging is 4.2 V. FIG. 7 shows transitions of the current differences obtained by deducting the current values of micro-short-circuited cells (in five patterns, i.e., 100Ω, 200Ω, 300Ω, 400Ω, and 500Ω) from the current value of a normal cell.

In a period before switching from CC charging to CV charging (see region b), a normal cell and a micro-short-circuited cell are charged at the same current value by CC charging, and thus a current difference is zero. A large current difference occurs in switching from CC charging to CV charging (see region b). At this time, as a value of micro-short circuit resistance decreases (as a micro-short circuit develops further), a current difference increases. For example, when the micro-short circuit resistance is 100Ω, a current difference at the time of switching is 1.7 A, which is about three times greater than an electric current for CC charging (0.58 A).

The above described threshold value for determining presence or absence of a micro-short circuit is determined based on characteristics of a cell, a target current value at the time of CC charging, a voltage value at the time of switching from CC charging to CV charging (the above described first preset value), and a boundary value of the micro-short circuit resistance for determination of a normal cell. For example, the threshold value is set around 1.7 A in the case where the micro-short circuit resistance for determination of a normal cell is set equal to or greater than 100Ω and an inspection is performed under the above described conditions. Micro-short-circuited cells of 200Ω, 300Ω, 400Ω, and 500Ω shown in FIG. 7 are determined as normal cells, as their current differences described above are less than 1.7 A.

Figure 8:
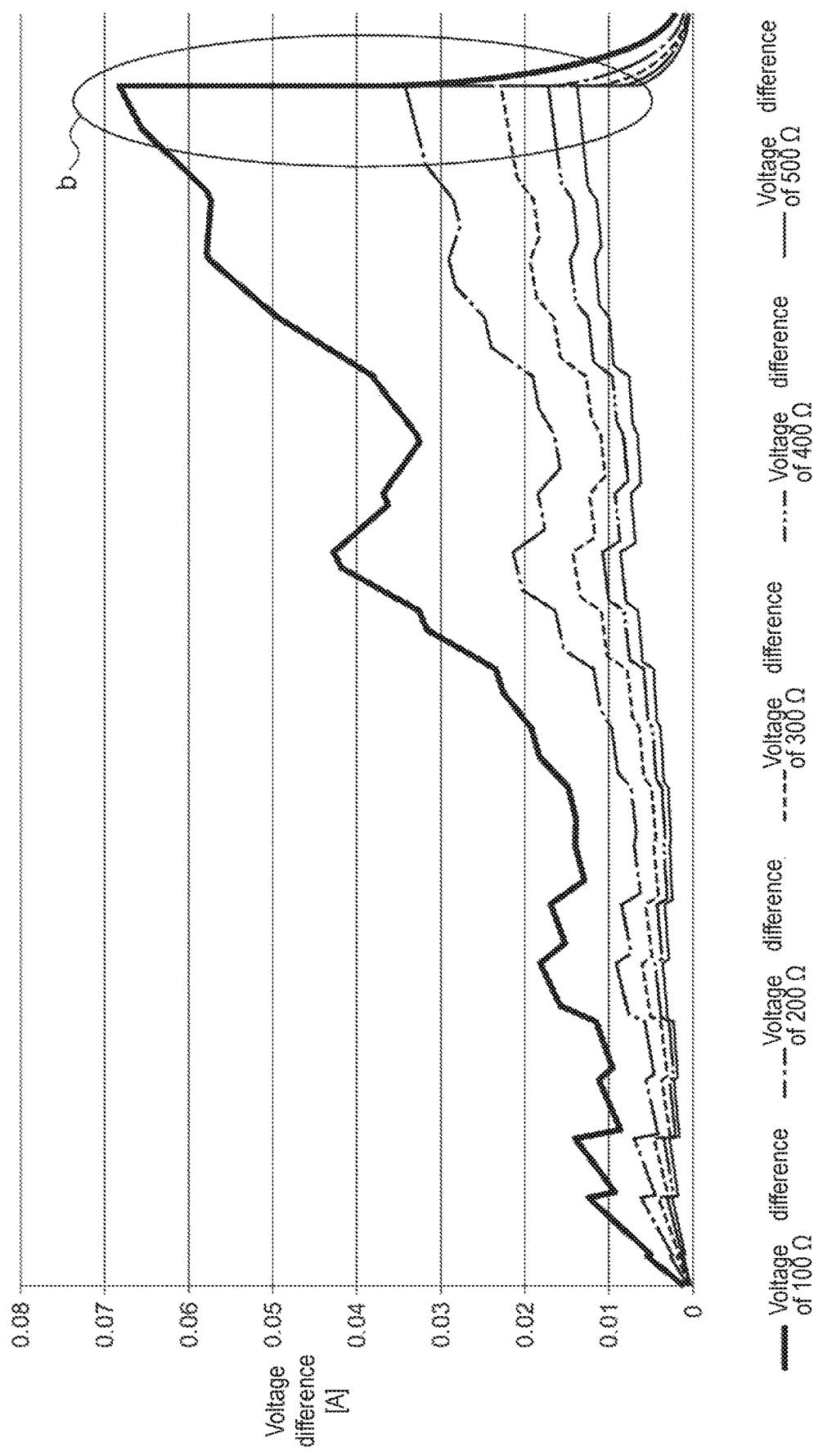
FIG. 8 is a view summarizing voltage differences between a normal cell and a micro-short-circuited cell in the simulation results of the inspection method according to the first exemplary embodiment of the present invention.

FIG. 8 is a view summarizing voltage differences between a normal cell and a micro-short-circuited cell in the simulation results of the inspection method according to the first exemplary embodiment of the present invention. As the switching point from CC charging to CV charging (see region b) approaches, the voltage differences grow larger and reach the maximum at the time of switching (see region b). However, even in the case of a micro-short-circuited cell of 100Ω, a voltage difference between the micro-short-circuited cell and a normal cell is about 70 mV, which is a value less than 2% of the cell voltage. It can be seen from FIGS. 7 and 8 that presence or absence of a micro-short circuit can be determined more easily by referring to a current difference than by referring to a voltage difference at the time of switching from CC charging to CV charging (see region b).

As described above, the first exemplary embodiment utilizes a peak current generated at the time of switching from CC charging to CV charging, thereby enabling determination of presence or absence of a micro-short circuit with high accuracy in a short period of time. The above described way in which a micro-short circuit is detected based on the voltage of a cell after a suspension period provided after a charging process requires several days to detect a micro-short circuit. On the other hand, the detection method according to the first exemplary embodiment requires only a few hours to finish the inspection.

The method utilizing a peak current generated at the time of switching from CC charging to CV charging enables detection of high-resistance micro-short circuit equal to or greater than 100Ω. Contrary to this, a conventional method of monitoring the voltage can hardly detect a micro-short circuit with high accuracy without a progress in a value of the micro-short circuit resistance to several tens of ohms.

The conventional method cannot hardly determine whether a voltage variation is caused by a micro-short circuit or by other reasons, such as a temperature change, in a stage where a value of micro-short circuit resistance is several hundred ohms.

Second Exemplary Embodiment

FIG. 9 is a view of a configuration of power storage system 5 according to a second exemplary embodiment of the present invention. Power storage system 5 includes a power storage unit formed of power storage modules 611-6mn, power converter 40, DC/DC converters 41-4m, a master management device 51, and slave management devices 52-5m. The power storage unit includes m strings of power storage modules connected in parallel (m is an integer equal to or greater than 2), and each of the strings includes n power storage modules connected in series (n is an integer equal to or greater than 1). Each of the strings including n power storage modules connected in series may be formed of a rack.

Power paths for charging/discharging strings 61-6m are combined to one power path and connected to power converter 40. Power converter 40 is connected between strings 61-6m and system 2. Power converter 40 is configured to convert direct current power (DC power) discharged from strings 61-6m into alternating current power (AC power) to output the AC power to system 2, and convert AC power received from system 2 into DC power to charge strings 61-6m.

Power converter 40, which may be implemented by a typical power conditioner system (PCS), includes a bidirectional DC/DC converter (not shown) and a bidirectional inverter (not shown). The bidirectional DC/DC converter controls CC charging/discharging or CV charging/discharging. The bidirectional inverter converts DC power into AC power or AC power into DC power. Note that, the bidirectional inverter may serve the both functions instead of providing the bidirectional DC/DC converter.

First DC/DC converter 41 of first string 61 is provided between power converter 40 and power storage modules 611-61n. First DC/DC converter 41 is controlled by first management device 51. The other DC/DC converters from second DC/DC converter 42 of second string 62 to m-th DC/DC converter 4m of m-th string 6m are configured in the same manner as that of first DC/DC converter 41. As management devices 51-5m respectively control DC/DC converters 41-4m, charging/discharging of each of strings 61-6m can be controlled independently.

Each of power storage modules 611-61n of first string 61 includes a plurality of cells, a current sensor, a voltage sensor, and a controller. The controller notifies management device 51 of a current value detected by the current sensor and a voltage value detected by the voltage sensor through a communication line. In the same manner, the other power storage modules from power storage modules 621-62n of second string 62 to power storage modules 6m1-6mn of m-th string 6m also notifies the other management devices from second management device 52 to m-th management device 5m of the corresponding current values and voltage values, respectively. Slave management devices 52-5m notify master management device 51 of current values and voltage values of the power storage modules through communication lines, respectively.

Master management device 51 has the configuration and function shown in FIG. 2 that are the same as those of inspection device 10 of the first exemplary embodiment, and is configured to determine presence or absence of a micro-short circuit of strings 61-6m, recognizing strings 61-6m as inspection target cells of the first exemplary embodiment. Specifically, master management device 51 is configured to instruct power converter 40 to perform CC charging to charge the power storage unit, and then perform CV charging to charge the power storage unit when a voltage value of the power storage unit reaches a preset value. Management device 51 is configured to determine presence or absence of a micro-short circuit of each of strings 61-6m based on a peak current value of each of strings 61-6m generated at the time of switching from CC charging to CV charging.

For example, management device 51 calculates a difference between a peak current value of one target string and an average value of the peak current values of all the strings excluding the maximum and minimum values at the time of switching from CC charging to CV charging. Management device 51 estimates that a micro-short circuit occurs in the target string when the difference is equal to or greater than a threshold value, and estimates that no micro-short circuit occurs in the target string when the difference is less than the threshold value. When estimating that a micro-short circuit occurs, management device 51 causes the user interface to issue an alert message indicating the possibility of occurrence of a micro-short circuit in the target string. Then, a maintenance manager inspects the string subjected to the alert message, and makes a final determination regarding presence or absence of a micro-short circuit.

Instead of using a detected peak current value, the peak current value may be estimated by dividing a voltage value, which is obtained by subtracting a detected voltage from a constant voltage at the time of switching from CC charging to CV charging, by an internal resistance value of each of the power storage modules. When power storage system 5, which is formed of multiple parallel-series connections, includes a large number of parallel connections or a small number of series connections, the internal resistance decreases in each of the power storage modules, and when power storage system 5 includes a small number of parallel connections or a large number of series connections, the internal resistance increases in each of the power storage modules. High internal resistance leads to a reduction in contribution of micro-short circuit resistance, which results in a decrease in the detection accuracy of a micro-short circuit, and low internal resistance leads to an increase in contribution of micro-short circuit resistance, which results in an increase in the detection accuracy of a micro-short circuit.

As described above, the second exemplary embodiment enables estimation of presence or absence of a micro-short circuit of the power storage unit at the time of charging of power storage system 5.

The present invention has been described based on the exemplary embodiments. The above exemplary embodiments are intended to be illustrative only, and the person of ordinary skill in the art will understand that various modified examples are possible for the combination of configuration elements and processing processes in the exemplary embodiments and that such modifications are also within the scope of the present invention.

In the above first exemplary embodiment, a difference between peak current values of each of inspection target cells S2-Sn and of reference cell S1 at the time of switching from CC charging to CV charging is compared with the above described threshold value, however, peak current values of each of inspection target cells S2-Sn may be compared with a threshold value for peak current determination obtained in advance by deducting a theoretical peak current value of reference cell S1 from the threshold value. In such a case, a configuration without reference cell S1 can be employed. Also in the second exemplary embodiment, a peak current value of the target string may be compared with the threshold value for peak current determination obtained in advance, instead of comparing a difference between the peak current value of the target string and an average value of the peak currents with the above described threshold value.

In the second exemplary embodiment, management device 51 to control first string 61 serves as a master device, however, management device 51 may serve as a slave device and another management device may be provided as a master device to control slave management devices 51-5m. In the second exemplary embodiment, power storage system 5 is a stationary power storage system as an example, but may be an on-vehicle power storage system. In such a case, a motor is connected to power storage system 5 instead of system 2, and power converter 40 is equipped with a charging plug to be connected to an external charging device.

The exemplary embodiments may be specified by items described below:

[Item 1]

Inspection device (10) including:

input and output device (17) configured to instruct charging device (21-2n) capable of charging cell (S1-Sn) to perform constant current charging or constant voltage charging, and acquire a voltage value and a current value of cell (S1-S2) from charging device (21-2n); and controller (11) configured to instruct charging device (21-2n) to perform constant current charging of cell (S1-Sn), and perform constant voltage charging of cell (S1-Sn) when a voltage value of cell (S1) acquired from charging device (21-2n) reaches a preset value, wherein controller (11) is configured to determine presence or absence of a micro-short circuit in cell (S2-Sn) with reference to a peak current value of cell (S2-Sn) generated in switching from the constant current charging to the constant voltage charging.

This configuration enables determination of presence or absence of a micro-short circuit in cell (S2-Sn) with high accuracy in a short period of time.

[Item 2]

Inspection device (10) according to item 1, wherein a plurality of charging devices (21-2n) are provided, wherein one of charging devices (21-2n) is connected to reference cell (S1), and at least another one of charging devices (22-2n) is connected to an inspection target cell, wherein controller (11) is configured to instruct charging devices (21-2n) to perform constant current charging, and perform constant voltage charging when a voltage value of reference cell (S1) reaches a preset value, and wherein controller (11) is configured to calculate a difference between a peak current value of inspection target cell (S2-Sn) and a current value of reference cell (S1), the peak current value of inspection target cell (S2-Sn) being generated in switching from the constant current charging to the constant voltage charging, and determine that inspection target cell (S2-Sn) is a cell with a micro-short circuit when the difference is greater than a threshold value.

This configuration enables determination of presence or absence of a micro-short circuit in inspection target cell (S2-Sn) with high accuracy in a short period of time by comparing a peak current value of inspection target cell (S2-Sn) and a current value of reference cell (S1) in the same condition as that of inspection target cell (S2-Sn).

[Item 3]

An inspection method including:

a first step of instructing charging device (21-2n) capable of charging cell (S1-Sn) to perform constant current charging of cell (S1-Sn);

a second step of acquiring a voltage value and a current value of cell (S1-Sn) from charging device (21-2n);

a third step of instructing charging device (21-2n) to perform constant voltage charging of cell (S1-Sn) when a voltage value of cell (S1) acquired from charging device (21-2n) reaches a preset value; and a fourth step of determining presence or absence of a micro-short circuit in cell (S2-Sn) with reference to a peak current value of cell (S2-Sn) generated in switching from the constant current charging to the constant voltage charging.

This configuration enables determination of presence or absence of a micro-short circuit in cell (S2-Sn) with high accuracy in a short period of time.

[Item 4]

The inspection method according to item 3, wherein a plurality of charging devices (21-2n) are provided, wherein one of charging devices (21-2n) is connected to reference cell (S1), and at least another one of the charging devices (22-2n) is connected to an inspection target cell, wherein in the first step, charging devices (21-2n) are instructed to perform constant current charging, wherein in the third step, charging devices (21-2n) are instructed to perform constant voltage charging when a voltage value of reference cell (S1) reaches a preset value, and wherein in the fourth step, a difference between a peak current value of inspection target cell (S2-Sn) and a current value of reference cell (S1) is calculated, the peak current value of inspection target cell (S2-Sn) being generated in switching from the constant current charging to the constant voltage charging, and the inspection target cell is determined as a cell with a micro-short circuit when the difference is greater than a threshold value.

This configuration enables determination of presence or absence of a micro-short circuit in inspection target cell (S2-Sn) with high accuracy in a short period of time by comparing a peak current value of inspection target cell (S2-Sn) and a current value of reference cell (S1) in the same condition as that of inspection target cell (S2-Sn).

[Item 5]

An inspection program that causes a computer to execute:

a first process of instructing a charging device (21-2n) capable of charging cell (S1-Sn) to perform constant current charging of cell (S1-Sn);

a second process of acquiring a voltage value and a current value of cell (S1-Sn) from charging device (21-2n);

a third process of instructing charging device (21-2n) to perform constant voltage charging of cell (S1-Sn) when a voltage value of cell (S1) acquired from charging device (21-2n) reaches a preset value; and a fourth process of determining presence or absence of a micro-short circuit in cell (S2-Sn) with reference to a peak current value of cell (S2-Sn) generated in switching from the constant current charging to the constant voltage charging.

This configuration enables determination of presence or absence of a micro-short circuit in cell (S2-Sn) with high accuracy in a short period of time.

[Item 6]

Management device (51) configured to manage a power storage unit including m strings (61) connected in parallel, where m is an integer equal to or greater than 2, each of the strings (61) including n power storage modules (611) connected in series, where n is an integer equal to or greater than 1, the management device including:

input and output device (17) configured to instruct charging and discharging device (40) to perform constant current charging or constant voltage charging of the power storage unit, and acquire at least a voltage value from each of the power storage modules (611-6mn), the charging and discharging device being configured to charge and discharge the power storage unit; and controller (11) configured to instruct charging and discharging device (40) to perform constant current charging of the power storage unit, and perform constant voltage charging of the power storage unit when a voltage value of the power storage unit reaches a preset value, wherein controller (11) is configured to estimate presence or absence of a micro-short circuit of each of strings (61-6m) with reference to a peak current value of each of strings (61-6m) generated in switching from the constant current charging to the constant voltage charging.

This configuration enables estimation of presence or absence of a micro-short circuit in each of strings (61-6m) in charging the power storage unit.

[Item 7]

Power storage system (5) including:

a power storage unit including m strings (61) connected in parallel, where m is an integer equal to or greater than 2, each of strings (61) including n power storage modules (611) connected in series, where n is an integer equal to or greater than 1; and management device (51) according to item 6.

This configuration provides power storage system (5) that enables estimation of presence or absence of a micro-short circuit in each of strings (61-6m) in charging the power storage unit.

The invention claimed is:

1. An inspection device comprising:
an input and output device configured to acquire a voltage value and a current value of a cell from a charging device; and
a controller configured to instruct the charging device to perform constant current charging of the cell, and perform constant voltage charging of the cell when a voltage value of the cell acquired from the charging device reaches a preset value, wherein:
the controller is configured to acquire a peak current value of the cell generated in switching from the constant current charging to the constant voltage charging, and to determine presence or absence of a micro-short circuit in the cell based on the peak current value,
a plurality of charging devices are provided,
one of the plurality of charging devices is connected to a reference cell, and at least another one of the plurality of charging devices is connected to an inspection target cell,
the controller is configured to instruct the plurality of charging devices to perform constant current charging, and perform constant voltage charging when a voltage value of the reference cell reaches a preset value, and
the controller is configured to acquire a peak current value of the inspection target cell generated in switching from the constant current charging to the constant voltage charging, calculate a difference between the peak current value of the inspection target cell and a current value of the reference cell, and determine that the inspection target cell is a cell with a micro-short circuit when the difference is greater than a threshold value.

2. An inspection method comprising:
instructing a charging device to perform constant current charging of a cell;
acquiring a voltage value and a current value of the cell from the charging device;
instructing the charging device to perform constant voltage charging of the cell when a voltage value of the cell acquired from the charging device reaches a preset value;
acquiring a peak current value of the cell generated in switching from the constant current charging to the constant voltage charging; and
determining presence or absence of a micro-short circuit in the cell based on the peak current value, wherein:
a plurality of charging devices are provided, and
the method comprises:
connecting one of the plurality of charging devices to a reference cell, and at least another one of the charging devices to an inspection target cell,
instructing the charging devices to perform constant current charging,
instructing the charging devices to perform constant voltage charging when a voltage value of the reference cell reaches a preset value,
acquiring a peak current value of the inspection target cell generated in switching from the constant current charging to the constant voltage charging, and
calculating a difference between the peak current value of the inspection target cell and a current value of the reference cell, and determining that the inspection target cell is a cell with a micro-short circuit when the difference is greater than a threshold value.

3. A non-transitory computer readable medium storing an inspection program that causes a computer to execute:
instructing a charging device to perform constant current charging of a cell;
acquiring a voltage value and a current value of the cell from the charging device;
instructing the charging device to perform constant voltage charging of the cell when a voltage value of the cell acquired from the charging device reaches a preset value;
acquiring a peak current value of the cell generated in switching from the constant current charging to the constant voltage charging; and
determining presence or absence of a micro-short circuit in the cell based on the peak current value, wherein:
a plurality of charging devices are provided, and
the executed program further causes the computer to execute:
connecting one of the plurality of charging devices to a reference cell, and at least another one of the charging devices to an inspection target cell,
instructing the charging devices to perform constant current charging,
instructing the charging devices to perform constant voltage charging when a voltage value of the reference cell reaches a preset value,
acquiring a peak current value of the inspection target cell generated in switching from the constant current charging to the constant voltage charging, and
calculating a difference between the peak current value of the inspection target cell and a current value of the reference cell, and determining that the inspection target cell is a cell with a micro-short circuit when the difference is greater than a threshold value.

4. A management device configured to manage a power storage unit including m strings connected in parallel, where m is an integer equal to or greater than 2, each of the strings including n power storage modules connected in series, where n is an integer equal to or greater than 1, the management device comprising:
- an input and output device configured to acquire at least a voltage value from each of the power storage modules; and
- a controller configured to instruct a charging and discharging device to perform constant current charging of the power storage unit, and perform constant voltage charging of the power storage unit when a voltage value of the power storage unit reaches a preset value,
- wherein the controller is configured to acquire a peak current value of the each of the power storage modules generated in switching from the constant current charging to the constant voltage charging, and to estimate presence or absence of a micro-short circuit of each of the strings based on peak current value,
- a plurality of charging and discharging devices are provided,
- one of the plurality of charging and discharging devices is connected to a reference power storage module, and at least another one of the plurality of charging and discharging devices is connected to an inspection target power storage module,
- the controller is configured to instruct the plurality of charging and discharging devices to perform constant current charging, and perform constant voltage charging when a voltage value of the reference power storage module reaches a preset value, and
- the controller is configured to acquire a peak current value of the inspection target power storage module generated in switching from the constant current charging to the constant voltage charging, calculate a difference between the peak current value of the inspection target power storage module and a current value of the reference power storage module, and determine that the inspection target power storage module is a power storage module with a micro-short circuit when the difference is greater than a threshold value.

5. A power storage system comprising:
a power storage unit including m strings connected in parallel, where m is an integer equal to or greater than 2, each of the strings including n power storage modules connected in series, where n is an integer equal to or greater than 1; and
the management device according comprising:
- an input and output device configured to acquire at least a voltage value from each of the power storage modules; and
- a controller configured to instruct a charging and discharging device to perform constant current charging of the power storage unit, and perform constant voltage charging of the power storage unit when a voltage value of the power storage unit reaches a preset value,
- wherein the controller is configured to acquire a peak current value of the each of the power storage modules generated in switching from the constant current charging to the constant voltage charging, and to estimate presence or absence of a micro-short circuit of each of the strings based on peak current value,
- a plurality of charging and discharging devices are provided,
- one of the plurality of charging and discharging devices is connected to a reference power storage module, and at least another one of the plurality of charging and discharging devices is connected to an inspection target power storage module,
- the controller is configured to instruct the plurality of charging and discharging devices to perform constant current charging, and perform constant voltage charging when a voltage value of the reference power storage module reaches a preset value, and
- the controller is configured to acquire a peak current value of the inspection target power storage module generated in switching from the constant current charging to the constant voltage charging, calculate a difference between the peak current value of the inspection target power storage module and a current value of the reference power storage module, and determine that the inspection target power storage module is a power storage module with a micro-short circuit when the difference is greater than a threshold value.

* * * * *